(12) United States Patent
Ng et al.

(10) Patent No.: US 8,680,401 B2
(45) Date of Patent: Mar. 25, 2014

(54) RECONFIGURABLE PRINTED CIRCUIT SENSOR SYSTEMS

(75) Inventors: Tse Nga Ng, Mountain View, CA (US); Jurgen H. Daniel, San Francisco, CA (US); Ana Claudia Arias, Los Gatos, CA (US); Brent Krusor, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 634 days.

(21) Appl. No.: 12/963,543

(22) Filed: Dec. 8, 2010

(65) Prior Publication Data

US 2012/0146463 A1    Jun. 14, 2012

(51) Int. Cl.
*H05K 1/00*     (2006.01)

(52) U.S. Cl.
USPC .......................................................... 174/254

(58) Field of Classification Search
USPC .................................. 174/254; 361/749–751
See application file for complete search history.

(56) References Cited

U.S. PATENT DOCUMENTS

| | | | |
|---|---|---|---|
| 5,270,711 A | 12/1993 | Knapp | |
| 5,583,749 A * | 12/1996 | Tredennick et al. | .......... 361/790 |
| 6,118,426 A | 9/2000 | Albert et al. | |
| 6,640,435 B2 * | 11/2003 | Balakrishnan | .................. 29/847 |
| 7,570,231 B2 | 8/2009 | Itokawa et al. | |
| 8,184,107 B2 | 5/2012 | Lee et al. | |
| 8,432,370 B2 | 4/2013 | Park et al. | |

OTHER PUBLICATIONS www.novaled.com/downloadcenter/OE-A_Brochure2009_lowres.pdf.

* cited by examiner

*Primary Examiner* — Jeremy C Norris
(74) *Attorney, Agent, or Firm* — Jonathan A. Small

(57) ABSTRACT

A printed circuit is produced with a base circuit and a number of optional circuit elements. One or more of the optional circuit elements may be added to the base circuit to determine or change the characteristics of the base circuit. Alternatively, one or more of the optional circuit elements may be removed from the base circuit to determine or change the characteristics of the base circuit. The base circuit and optional circuit elements may be printed on a single substrate. Mechanisms may be provided to facilitate the separation of the optional elements form the substrate either to introduce them into the base circuit or remove them from the base circuit to change the characteristics of the base circuit. A simple, low-cost, robust, and easy to use base circuit and optional circuit element is provided.

8 Claims, 11 Drawing Sheets

RECONFIGURABLE PRINTED CIRCUIT SENSOR SYSTEMS

BACKGROUND

The present disclosure is related to printed electronic circuitry, and more specifically to a device formed by printed electronic processes in which one or more elements of the circuit are reconfigurable.

There are today a relatively large number of different techniques for producing electronic devices. One family of such techniques, of interest herein, is commonly referred to as printed electronics. Devices formed by various methods fall within the definition of printed electronics. Screen-printing, traditional and digital lithography, flexography, and jet-printing are a number of the more common of such methods. In each case, a conductive, semi-conductive or insulating material is deposited over a substrate to form interconnected passive and/or active electronic components. Printing processes typically deposit materials in the form of a solution, a slurry or in the form of a powder. Thermal and laser transfer processes may also be used to print structures. In transfer processes, a layer such as a metal film may be transferred from a carrier substrate to another substrate. Known printed electronic processes can utilize a wide variety of organic and inorganic materials for these components.

Printed electronic processes take advantage of known, relatively simple printing techniques, and are thus typically less expensive and often less environmentally hazardous than traditional lithography and deposition techniques. Certain materials and processes used for printed electronics permit printing on non-crystalline substrates, such as paper, plastic, fabric, etc. Such processes may permit printing on flexible substrates, which is not easily done with conventional electronic device fabrication techniques. Furthermore, printing processes have been developed for non-planar surfaces, which is also a challenge for conventional electronic device fabrication techniques. However, in order to maintain low cost and/or substrate flexibility, the components produced by printed electronic processes are relatively large, the circuits are relatively simple, and the circuits are fixed in terms of circuit layout and characteristics once produced.

The applications for event sensors vary widely. One exemplary application for printed electronic circuits are sensors of one form or another. An event sensor, as used herein, is a device for detecting and indicating the occurrence, duration, and/or extent of an event or a series of events. Sensed events include acceleration, changes in temperature, opening of a container or package, etc. Additional electronic circuits for amplification, processing, display, and so on are commonly used to process the sensing signals issuing from these devices.

A common requirement for many applications is very low cost. There is a further common requirement for many applications that the sensor and even the display mechanism be flexible, for example permitting it to be applied over a non-planar structure, such as a medicine bottle, shipping package, etc. Still further, in some applications it is desirable to provide a sensor without a separate voltage source (e.g., without a battery). For this reason, printed electronic circuits are well-suited for certain sensor applications. However, the circuitry for such sensor applications are of a fixed configuration, and do not permit for reconfiguration in use. Thus, these devices are fabricated for a very specific use, which must generally be understood and factored into the device design, clearly prior to use of the device in the field.

SUMMARY

Accordingly, the present disclosure is directed to systems and methods for providing very simple, very low-cost, reconfigurable circuits that may be used in a wide variety of applications. A device according to the present disclosure comprises at least two electronic circuit elements that may be selectively reconfigurable, which for example means that they can be added to or taken out of a basic circuit.

A printed circuit is produced with a base circuit and a number of optional circuit elements. One or more of the optional circuit elements may be added to the base circuit to determine or change the characteristics of the base circuit. Alternatively, one or more of the optional circuit elements may be removed from the base circuit to determine or change the characteristics of the base circuit. The goal is to provide the base circuit and optional circuit elements in a simple, low-cost, robust, and easy to use manner.

An optional element may be added to the base circuit by applying, attaching, folding, sliding, rotating, etc., electrical contacts thereto into electrical communication with the base circuit. Similarly, an optional element may be taken from the base circuit by cutting away, folding, sliding, rotating or otherwise physically separating the optional element so as to remove the element from electrical contact with the base circuit. In this way, a device can be configured by a user to provide characteristics appropriate for the application of the device.

In one example, a printed circuit device may be provided with a user-settable timing circuit. Such a timing circuit might be provided on or with the packaging of a hair dying product to permit a user to select an appropriate dying time specific the user's selected color profile, hair types, etc. Another example is an adjustable sensitivity shock sensor, such as might be applied to a shipping package to indicate shock in transit. The sensitivity of the sensor may be set using the reconfigurable circuit so that the sensor indicates when the package has been subjected to shock above a desired threshold. A still further example is adjustable temperature sensing. Again, a shipping package may be provided with a reconfigurable sensor to indicate whether the package has been subjected to a threshold temperature elevation. The sensor temperature may be set by a user depending on the sensitivity of the contents of the package to heat or cold. These, however, are simply several illustrative examples of a wide range of possible applications, and not meant in any way to limit the scope of this disclosure or the claims that follow.

Accordingly, a reconfigurable printed electronic circuit comprises a substrate, a printed electronic base circuit with at least a portion thereof formed on said substrate, an optional printed electronic circuit element with at least a portion thereof formed on said substrate, a separation mechanism permitting an at least partial separation of said optional circuit element from said substrate, whereby separation of said optional circuit element by said separation mechanism results in a change in the circuit characteristics of said base circuit.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that descriptions of well known starting materials, processing techniques, components, equipment and other well known details are merely summarized or are omitted so as not to unnecessarily obscure the details of the present disclosure. Thus, where details are otherwise well known, we leave it to the application of the present disclosure to suggest or dictate choices relating to those details.

Figure 1:
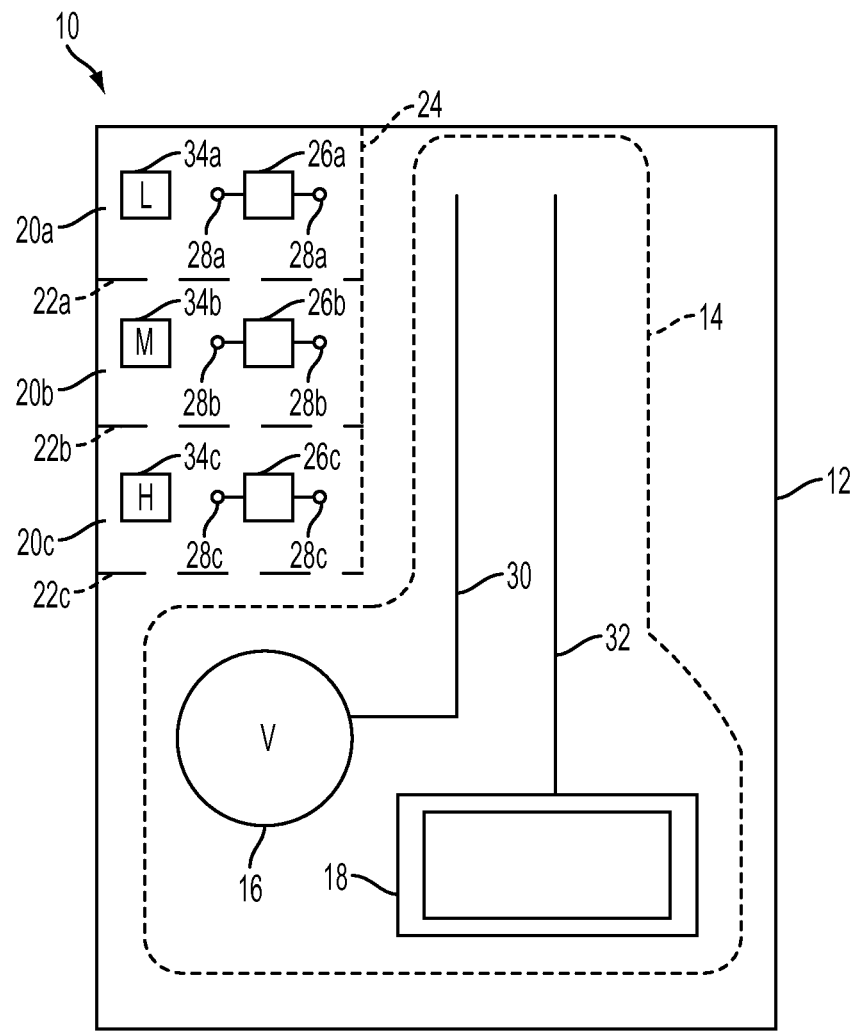
FIG. 1 is a schematic illustration of a reconfigurable printed circuit with optional circuit elements separated from a base circuit according an embodiment of the present disclosure.

With reference to FIG. 1, a device 10 including a reconfigurable printed electronic circuit according to an embodiment of the present disclosure is shown. Device 10 comprises an electrically insulating substrate 12, such as paper, plastic, etc. or a substrate that has been coated with an electrically insulating layer such as stainless steel foil coated with a polymer insulating film. In the embodiment of FIG. 1, a simple base circuit 14 is provided on substrate 12 by way of printed electronic processes.

We define "printed electronic process" for the purposes of this disclosure to exclude traditional photoresist-based process involving depositing, masking, exposing, etching, and further depositing (e.g., vacuum-based electronic fabrication techniques often referred to generally as photolithography). Examples of printed electronic process within the scope of this definition include screen-printing; traditional lithography; digital lithography; flexography; gravure; and inkjet-printing. In particular printed electronic processes may include additive deposition processes where all the layers of the circuit are patterned by selectively depositing materials where required without removing substantial amounts of other materials. Processes may include laser and heat transfer printing, nano-imprinting, pad printing, aerosol printing as well as continuous coating processes such as dip coating, spray coating, extrusion coating, slot coating, doctor blading and lamination. A printing process may include materials removal processes such as for trimming purposes or for patterning of via interconnects. Such processes may include laser ablation, die cutting or printing of solvents. Other processes not listed may also be within this definition. A circuit produced by a printed electronic process is referred to herein as a "printed electronic circuit."

In the embodiment shown in FIG. 1, base circuit 14 comprises a voltage source 16, which may be a battery, piezoelectric charge generator, solar cell, or other similar element. Voltage source 16 may be a piezoelectric material that generates a voltage in response to physical strain within its structure. An example of a material that may be employed in this embodiment is a piezoelectric polymer such as polyvinylidene fluoride (PVDF) as well as PVDF copolymers, such as polyvinylidene fluoride—trifluoroethylene (PVDF-TrFE, PVDF-TFE), etc. The PVDF may be a film, with or without a proof mass. When strained (e.g., by deflection), PVDF will produce a net charge. Alternatively, base circuit 14 may rely on a voltage source (not shown) external to device 10. Voltage source 16 may be a low cost, thin and light, robust element, and may be formed by the printed electronic processes used to form other elements on substrate 12.

Base circuit 14 further comprises an indicator 18, which may be a visual indicator such as a bistable, grayscale, emissive or reflective display. In other embodiments, the indication may be audible, thermal, haptic (tactile), radio-communicative, or other indicator element. In one embodiment, indicator 18 is an electrophoretic display. Such displays contain small, mobile particles that migrate in the presence of an electric field. The amount of particle movement, and hence the visible contrast or change in color or tone with the application an electric field, is a function of the duration and magnitude of the field. Such materials are compatible with printed electronic processes, thus the printed electronic processes used to form other elements on substrate 12 may also be used to form indicator 18. While an electrophoretic display element is described above, other display types may similarly be employed. For example, liquid crystal, electrochromic, electrowetting, light emitting (e.g., organic LED), interference, electrochemical, and other forms of displays may be used. In these cases, voltage from voltage source 16 may operate switching circuits, such as thin film transistors (TFT) in optional circuit elements 20a, 20b, 20c used to regulate the application of an appropriate driving current. Circuit 14 also may include a sensor such as an accelerometer, pressure sensor, acoustic sensor, thermal sensor, moisture sensor, chemical or biological sensor. As previously described, this sensor may also be at least part of voltage source 16. An example in which the sensor is integrated with the power source would be a piezoelectric cantilever which deflects upon sensing a force due to a pressure change or an acceleration and the stress due to deflection of the piezoelectric cantilever generates an electric charge which can be used to power an electronic circuit.

Device 10 further comprises a plurality of optional circuit elements 20a, 20b, 20c. Although three such optional circuit elements are shown in FIG. 1, it will be appreciated that in various embodiments one or more optional elements may form a part of device 10. Elements 20a, 20b, 20c are considered optional in that one or more may be added to base circuit 14, as determined for example by the user in light of the application of device 10.

In the embodiment of FIG. 1, perforations, embedded tear-strips, selectively thinned regions of the substrate or similar separation mechanisms 22a, 22b, 22c separate elements 20a, 20b, 20c. Separation mechanisms 22a, 22b, 22c facilitate effective tearing or separating of elements 20a, 20b, 20c from one another and in part from substrate 12. It will be noted here that use of the term separation mechanism includes, but is not limited to, elements facilitating any form of disconnection of at least a portion of a substrate, and not limited to those facilitating simply tearing a portion of a substrate. For example, mechanisms for removing temporarily adhering portions of a substrate are contemplated. Furthermore, the act of separation at a separation mechanism includes both separation to enable connection of an element to a base circuit as well as removal of an element from the base circuit, each as described further below.

A fold line 24 permits the separated elements 20a, 20b, 20c to be folded and controllably placed into electrical contact with base circuit 14, as described further below. While the separation mechanisms 22a, 22b, 22c and fold line 24 are one example of a method of introducing optional circuit elements 20a, 20b, 20c into base circuit 14, many other methods are contemplated by the present disclosure, as discussed further below and as will be appreciated by one skilled in the art given the present disclosure.

In a simple embodiment, each of elements 20a, 20b, 20c comprise a printed electronic component 26a, 26b, 26c, respectively, which may in one embodiment be printed resistors, as well as terminals 28a, 28b, 28c for electrically connecting to base circuit 14, for example by way of conductors 30, 32. In the embodiment wherein printed electrical components 26a, 26b, 26c are resistors, the resistance values $R_x$, for each may be chosen such that $R_{26a} < R_{26b} < R_{26c}$. In device 10, if voltage source 16 is a piezoelectric device which produces a voltage on conductor 30 in response to an acceleration (or shock), a progressively higher voltage from voltage source 16 (i.e., a greater level of acceleration) is required to produce an indication on indicator 18 as element 20a is added to the circuit, element 20b is added to the circuit, and/or element 20c is added to the circuit, respectively. It should be noted that the electronic component 26 or printed electronic circuit element may also include a sensing element. For example, printed electrical components 26a to 26c may be accelerometer structures with different proof mass values. Printed electrical component 26a may have a small proof mass with small weight and printed electrical component 26c may have a larger proof mass weighing more. Therefore, the sensitivity of printed device 10 to an acceleration may be chosen by selecting a specific sensing element. Printed electrical components 26 may be also chemical sensors with sensitivity to different chemicals and depending on what chemical substance the user wants to detect a specific sensing element is chosen.

Figure 2:
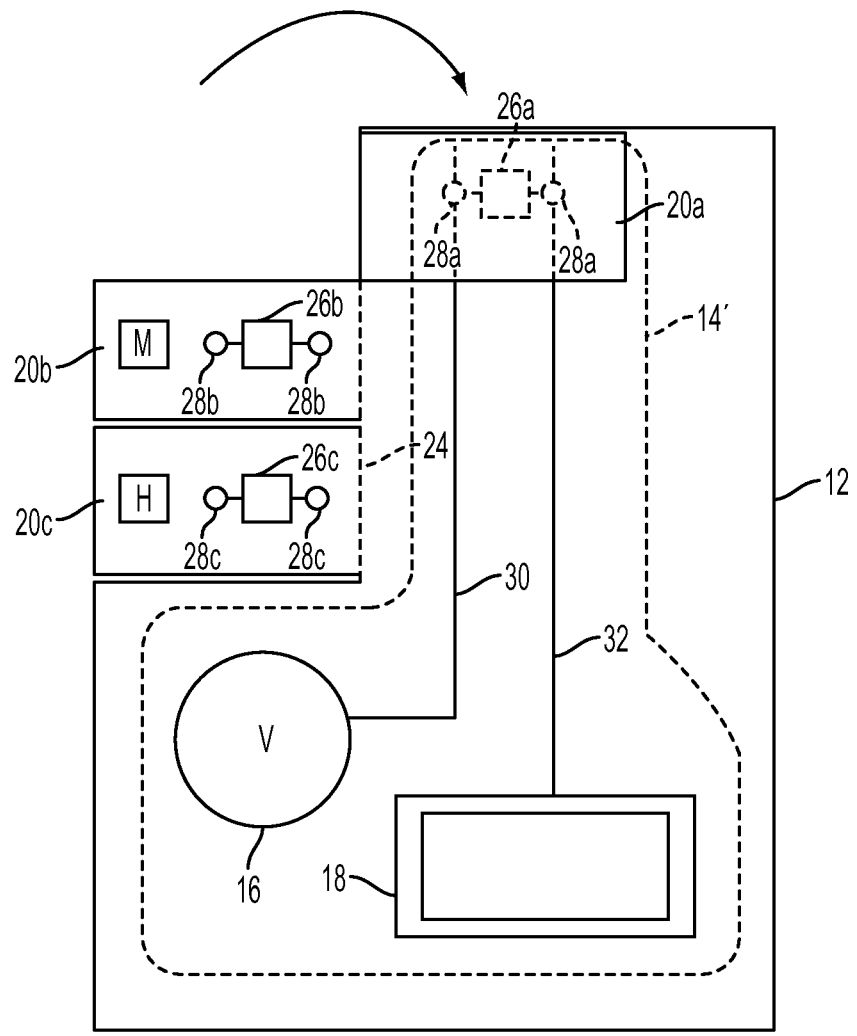
FIG. 2 is a schematic illustration of a reconfigurable printed circuit with one optional circuit element introduced into a base circuit according an embodiment of the present disclosure.

FIG. 2 illustrates optional circuit elements 20a, 20b, 20c separated at separation mechanisms 22a, 22b, 22c, and optional element 20a folded over fold line 24 such that terminals 28a make electrical contact with conductors 30, 32. Printed electrical component 28a is thereby introduced into base circuit 14. In this example, the resistance value of electrical component 28a may be relatively low, such that a relatively small acceleration force can result in triggering indicator 18. That is, a high sensitivity shock detector can be provided. Alternatively, should optional circuit element 20b or 20c be introduced into circuit 14 as described above, in place of or in addition to optional circuit element 20a, a relatively higher resistance is introduced into circuit 14, and a greater voltage from voltage source 16 is required to trigger indicator 18. That is, a sensor requiring a great degree of shock to trigger an indication is provided. Since more than one optional circuit element 20a, 20b, 20c can be introduced into circuit 14, a wide variation of sensitivity options can be provided to a user.

Calibration data for the optional circuit elements 20a, 20b, 20c can be printed directly on device 10 where appropriate. For example, if device 10 is a shock sensor for a shipping package, a weight range of the package, a sensitivity value, or other indicator 34a, 34b, 34c (FIG. 1) can be printed on each optional circuit element to provide the user with a simple mechanism for determining which optional circuit element 20a, 20b, 20c to add to base circuit 14 for the specific application.

While optional circuit elements 20a, 20b, 20c have been described above as being resistors, many other circuit elements, passive and active, are contemplated by the present disclosure as potentially forming a part of those elements, from simple interconnections to complex circuits, and combinations thereof. For example, in the above-mentioned timer for hair coloring products, the voltage source may be a battery, and optional circuit elements may comprise combinations of electrical components, such as resistors and capacitors, that produce different discharge time (RC constants) for each optional circuit element. Folding over a particular optional circuit element into electrical contact with base circuit 14 selects a desired length of time for a count-down circuit, after which the indicator 18 indicates that the selected time has elapsed. Whatever the application, a common characteristic of the optional circuit elements is that they are formed by way of printed electronic processes.

Figure 3:
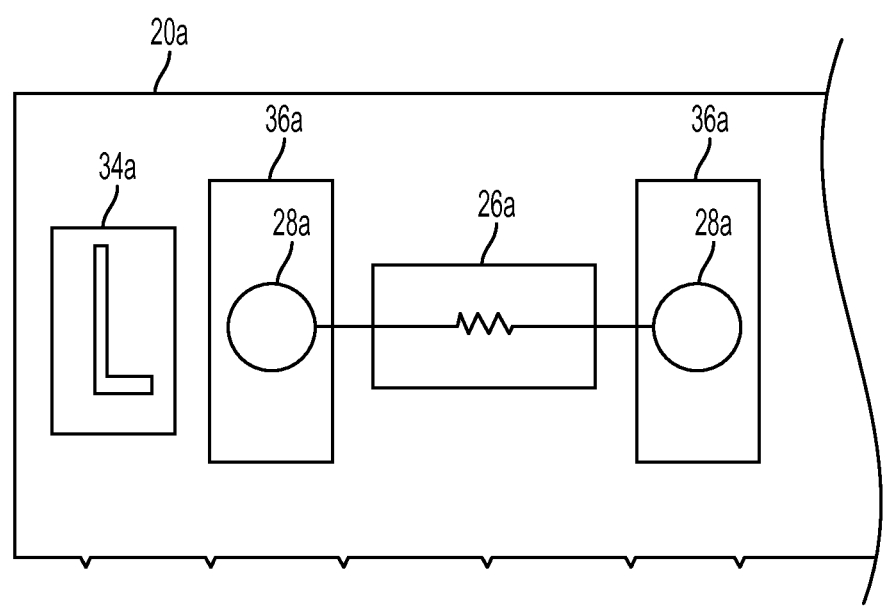
FIG. 3 is a schematic illustration of an optional circuit element according an embodiment of the present disclosure.

With reference to FIG. 3, one optional circuit element 20a is shown in detail. One or more securing mechanisms 36a can be provided on the surface of optional circuit element 20a, separate from, over, or part of other printed components (such as terminals 28a, as illustrated in FIG. 3) to adhere optional circuit element 20a in place in base circuit 14 when desired. Indeed, in one example terminals 28a may be electrically conductive adhesive stickers such that both functions—electrical and physical connection to base circuit 14—are provided by the same element. Securing mechanism 36a can permanently secure optional circuit element 20a within base circuit 14 (i.e., undoing the connection would typically damage the base circuit), for example by way of an adhesive dot, one part of a two part contact adhesive, etc., or temporarily secure optional circuit element 20a within base circuit 14 (i.e., such that the connection may be made, removed, made again and so on without necessarily damaging the base circuit), for example by way of hook and loop fastener, adhesive dot, etc.

Figure 4:
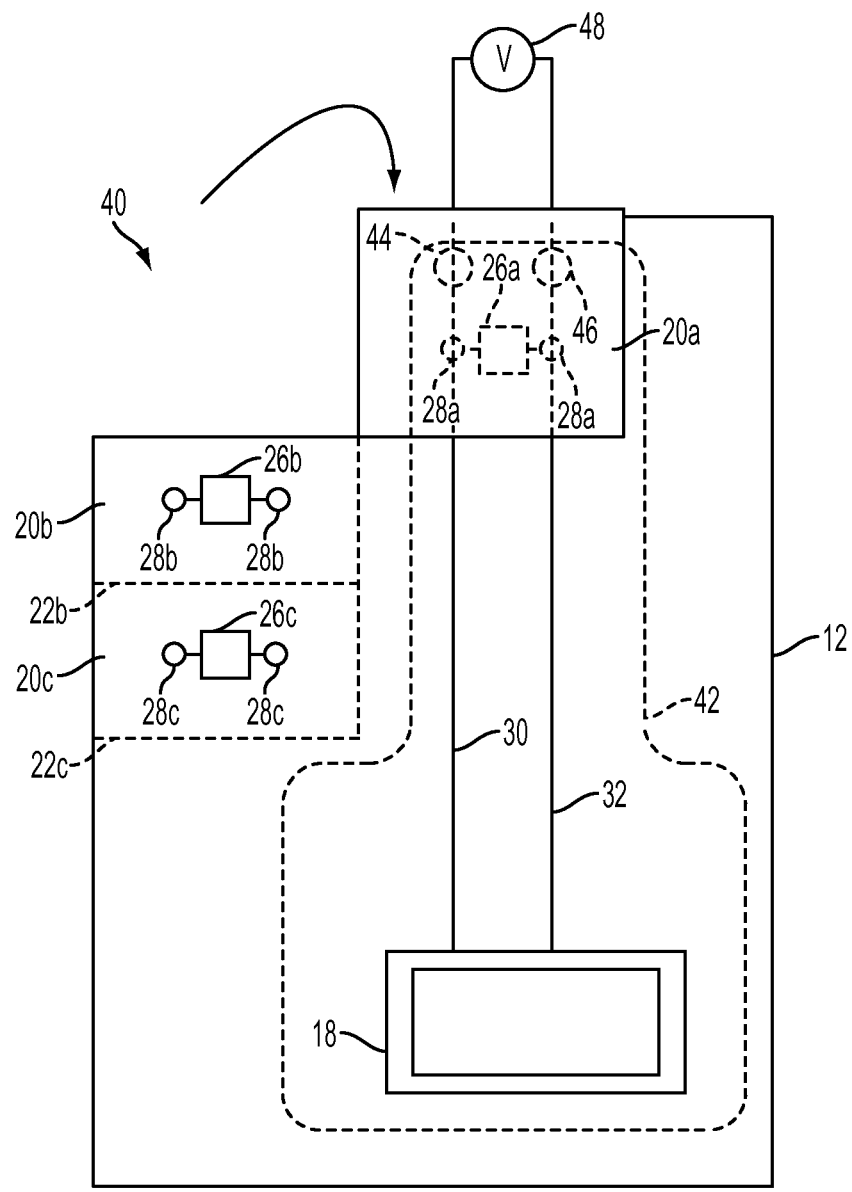
FIG. 4 is a schematic illustration of another reconfigurable printed circuit with one optional circuit element introduced into a base circuit and an external voltage supply according an embodiment of the present disclosure.

With reference to FIG. 4, a reconfigurable printed circuit device 40 according to another embodiment of the present disclosure is illustrated in which a base circuit 42 does not itself carry a power supply, but rather may be connected via terminals 44, 46 to an external power supply 48. According to this embodiment, a sensor may also be external to the base circuit, again such as a piezoelectric voltage supply, so that the device 40, the voltage supply/sensor 48 or both can be reused to reduce cost, waste, etc. Furthermore, additional options are provided to the user for connecting the reconfigurable printed circuit device 40 to a variety of different sensor configurations (e.g., shock, thermal, pressure, acoustic, etc.)

Figure 5A:
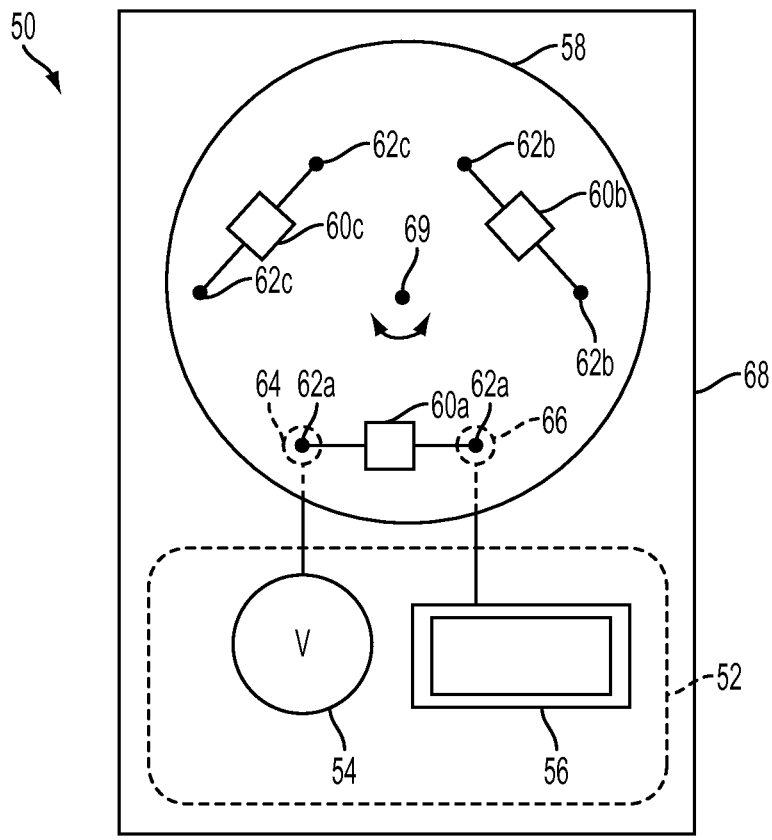
FIGS. 5A and 5B are schematic illustrations of reconfigurable printed circuit including two different selection mechanisms, respectively, for selecting the inclusion of an optional circuit element in or exclusion of an optional circuit element from a base circuit according embodiments of the present disclosure.
Figure 5B:
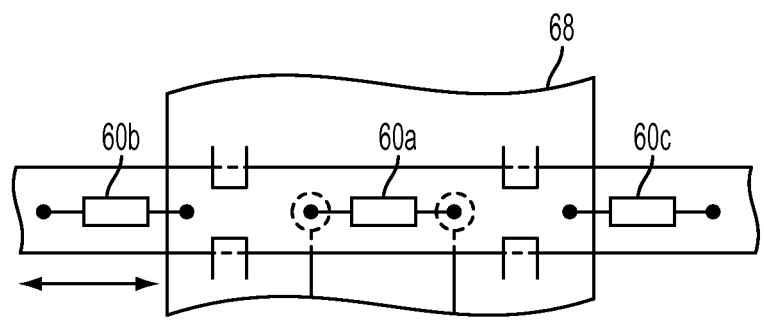

With reference to FIG. 5A, yet another selection device 50 is illustrated for selecting the inclusion of an optional circuit element in or exclusion of an optional circuit element from a base circuit. In the embodiment shown in FIG. 5A, base circuit 52 comprises a simple voltage source 54 and indicator 56, of a type similar to that described above. A configuration selection mechanism is provided which in the embodiment shown comprises a rotatable disk 58, rotatably secured to substrate 68 by pin 69 drum 58. Many other similar mechanisms may be provided, such as laterally or transversely displaceable circuit carrying plates (e.g., as shown in FIG. 5B), drums, rolls, removably replaceable circuit carrying devices, and so forth, having circuitry thereon formed by printed electronic processes. In the embodiment shown in FIG. 5A, printed on the surface of disk 58 are a variety of electrical components 60a, 60b, 60c, and so on, with corresponding terminals 62a, 62b, 62c, preferably formed by printed electronic processes. As with the embodiments described above, the number of such different electrical components does not form a limitation of the present disclosure, and may be one or more.

Base circuit 52 presents terminals 64, 66 (shown under disk 58) for connection to terminals 62a, 62b, 62c, dependent upon the rotational position of disk 58. While shown schematically, the embodiment of FIG. 5A may be tailored with additional or different elements to fit into a variety of different applications where simple and quick selection of an optional circuit element for inclusion in base circuit 52 is desired. Indeed, one rotational position for disk 58 may be such that no circuit element is presented for inclusion in base circuit 52. This may be desired when the circuit is to be in the "off" state, the default circuit connections (not shown) are to be utilized, etc.

Figure 6:
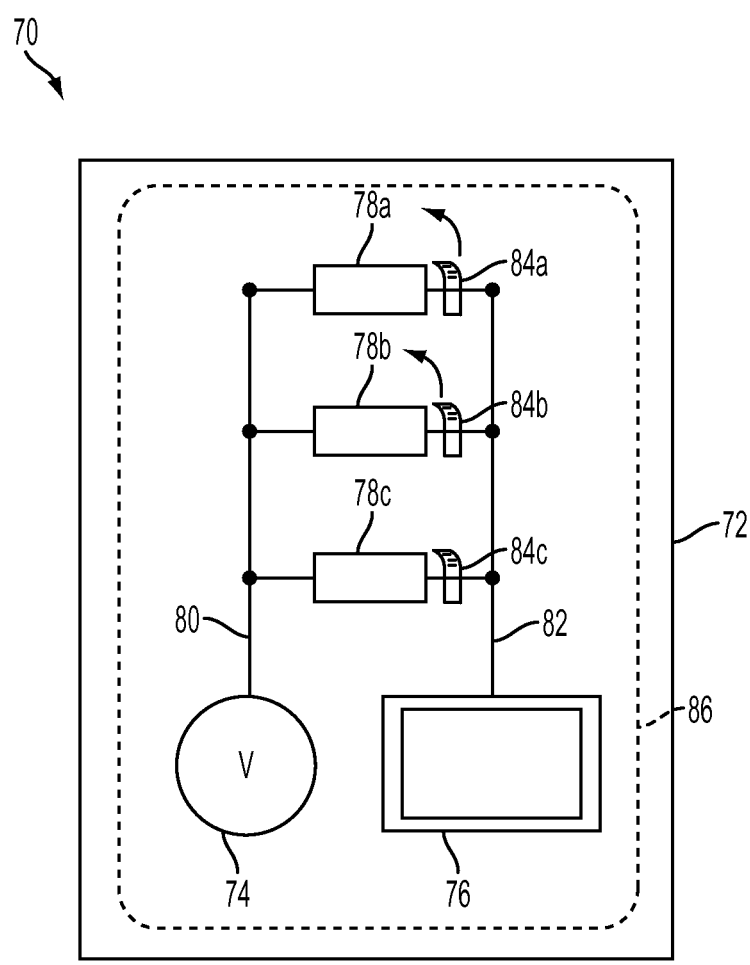
FIG. 6 is a schematic illustration of a reconfigurable printed circuit with optional circuit elements and associated separation mechanisms in the form of adhesive tabs secured to a substrate according an embodiment of the present disclosure.

With reference to FIG. 6, a reconfigurable printed circuit device 70 is illustrated according to a still further embodiment of the present disclosure, in which selected optional circuit elements may be removed from a base circuit to change the circuit characteristics of said base circuit. According to this embodiment, device 70 comprises a substrate 72 on which may be formed a voltage source 74 and indicator 76, for example of a type described herein above. While shown formed on substrate 72, either or both of voltage supply 74 and indicator 76 may alternatively be formed external to substrate 72 and connected thereto by way of terminals therefor (not shown).

One or more optional circuit elements 78a, 78b, 78c are formed on substrate 72, preferably by printed electronic processes. Each optional circuit element 78a, 78b, 78c is connected to conductors 80, 82, for electrically communicating with voltage source 74 and indicator 76, respectively. Thus, a base circuit 86 is formed to include, in the embodiment shown, voltage source 74, indicator 76, optional circuit elements 78a, 78b, 78c, and conductors 80 and 82. Between the connection of optional circuit elements 78a, 78b, 78c and either voltage source 74 or indicator 76 or both are disposed separation mechanisms 84a, 84b, 84c. In one embodiment, separation mechanisms 84a, 84b, 84c comprise removable adhesive tabs initially applied to substrate 72. A conductive path between optional circuit elements 78a, 78b, 78c and either voltage source 74 or indicator 76 is formed thereover. Many other forms of separation mechanism are contemplated, such as elements (not shown) formed on or a portion of the substrate in the conductive path that may be punched through or rubbed off, etc.

In operation, the initial base then includes voltage source 74, indicator 76, and optional circuit elements 78a, 78b, 78c. In order to reconfigure this circuit, one or more of separation mechanisms 84a, 84b, 84c may be removed from substrate 72. In so doing, removal of a separation mechanisms 78a, 78b for example, breaks the conduction path between voltage source 74 and indicator 76 through optional circuit elements 78a, 78b, as shown in FIG. 7.

Figure 7:
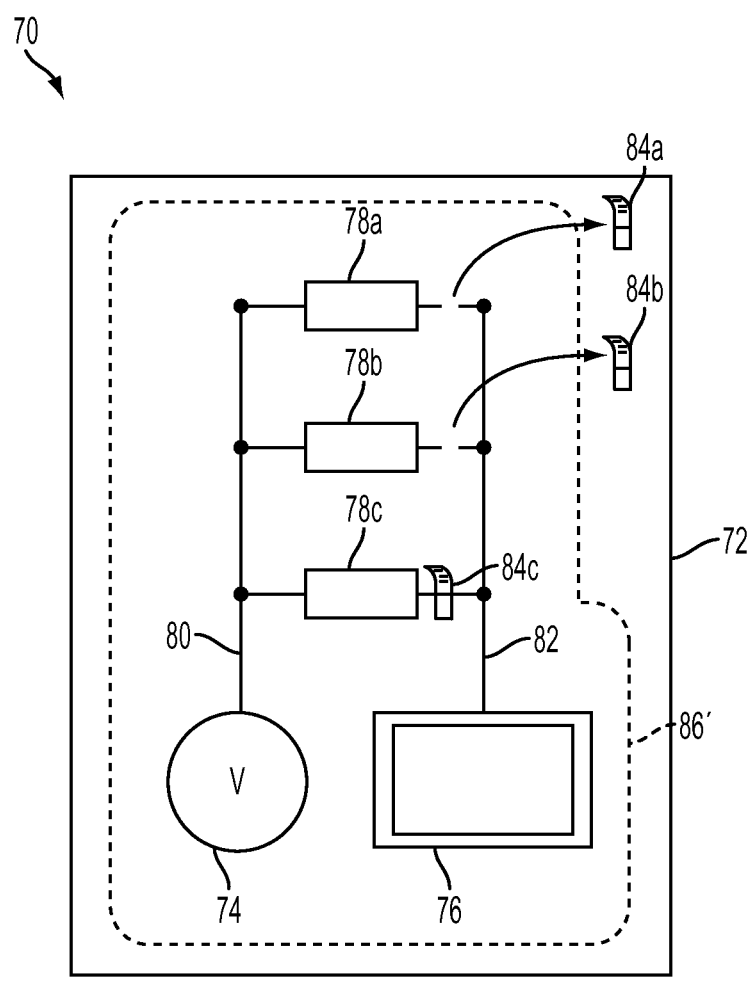
FIG. 7 is a schematic illustration of the reconfigurable printed circuit with optional circuit elements and associated separation mechanisms of FIG. 6, with several of the separation mechanisms removed from the substrate to thereby remove the optional circuit elements from base circuit.

While tabs over which a conductive path is formed constitute the embodiment illustrated in FIGS. 6 and 7, many other separation mechanisms may similarly be employed. For example, the separation mechanisms may themselves be conductive such that printing a conductive path thereover is not required. The optional circuit elements may themselves be removably attached to substrate 72 such that removal of an optional circuit element from the base circuit is accomplished by removal of the optional circuit element from the substrate. Many other embodiments will present themselves to one skilled in the art provided with the present disclosure.

Figure 8:
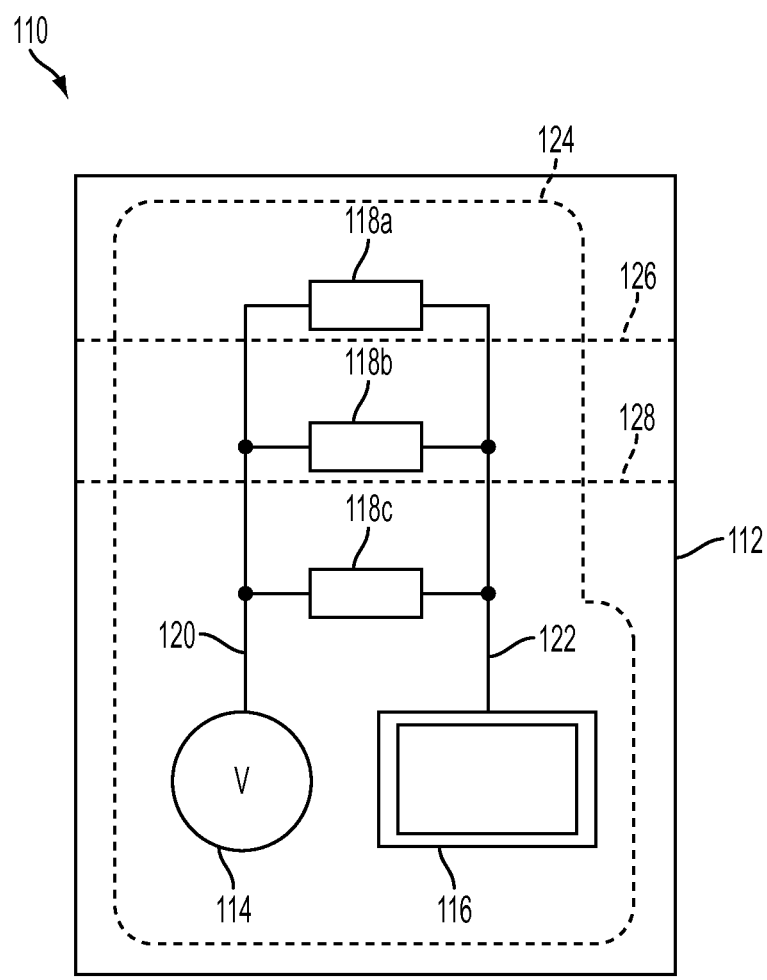
FIG. 8 is a schematic illustration of a reconfigurable printed circuit with optional circuit elements and associated separation mechanisms in the form of perforations facilitating removal of one or more optional circuit elements according an embodiment of the present disclosure.
Figure 9:
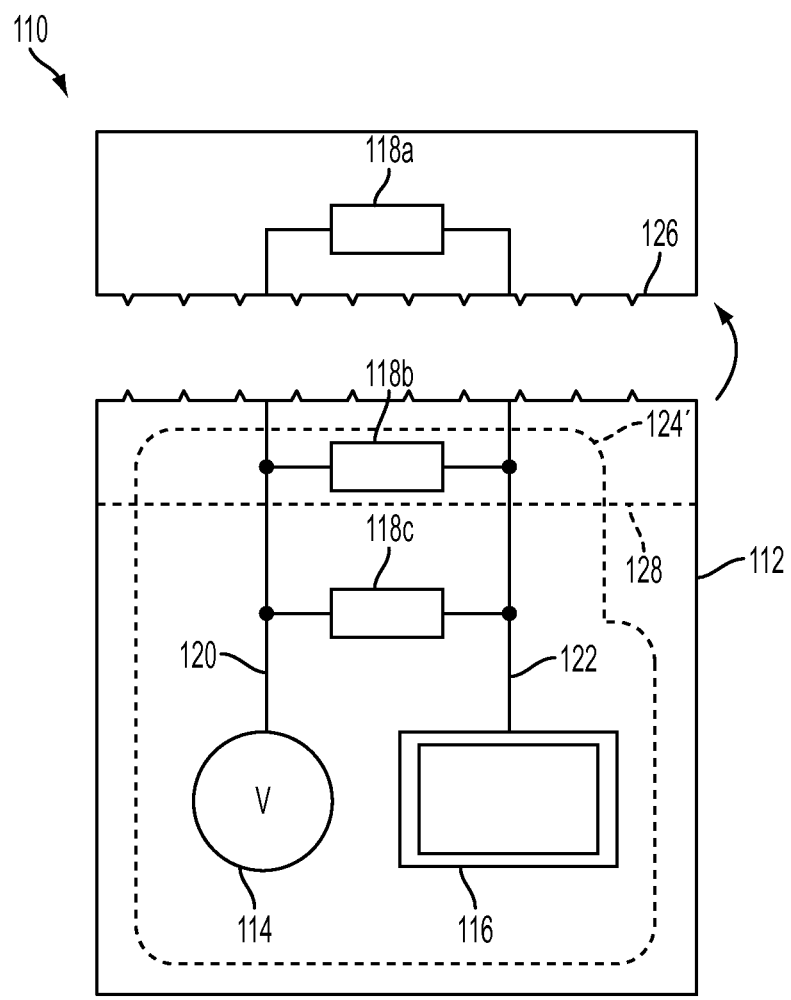
FIG. 9 is a schematic illustration of the reconfigurable printed circuit with optional circuit elements of FIG. 8, with one of the optional circuit elements removed from the substrate and hence removed from base circuit.

With reference to FIGS. 8 and 9, a reconfigurable printed circuit device 110 according to a yet further embodiment of the present disclosure is illustrated, in which selected optional circuit elements may be removed from a base circuit to change the circuit characteristics of a base circuit. According to this embodiment, device 110 comprises a substrate 112 on which may be formed a voltage source 114 and indicator 116, for example of a type described herein above. While shown formed on substrate 112, either or both of voltage supply 114 and indicator 116 may alternatively be formed external to substrate 112 and connected thereto by way of terminals therefor (not shown).

One or more optional circuit elements 118a, 118b, 118c are formed on substrate 112, preferably by printed electronic processes. Each optional circuit element 118a, 118b, 118c is connected to conductors 120, 122, for electrically communicating with voltage source 114 and indicator 116, respectively. Thus, a base circuit 124 is formed to include, in the embodiment shown, voltage source 114, indicator 116, optional circuit elements 118a, 118b, 118c, and conductors 120 and 122. A separation mechanism 126, 128 is provided between each of optional circuit elements 118a, 118b, 118c, respectively. In one embodiment, separation mechanisms 126, 128 comprise perforations facilitating the complete separation of portions of substrate 112, including optional circuit elements 118a, 118b. By removing a section of substrate 112 at separation mechanisms 126, 128 optional circuit elements 118a, 118b may be removed from base circuit 124, as illustrated in FIG. 9. Of course, separation may also occur by a cutting method.

According to still another embodiment of the present disclosure, a complete sensor device may be provided with reconfigurable attributes such as sensitivity, sensing conditions, etc. Accordingly, and with reference to FIG. 10, a device 90 comprises a substrate 92 on which may be formed a sensor-enabled voltage source 94, such as a piezoelectric pulse generator, described further below, and a multi-part indicator comprising indicator elements 96a, 96b, 96c, for example of a type described herein above. While shown formed on substrate 92, either or both of voltage source 94 and indicator elements 96a, 96b, 96c may alternatively be formed external to substrate 92 and connected thereto by way of terminals therefor (not shown).

Figure 10:
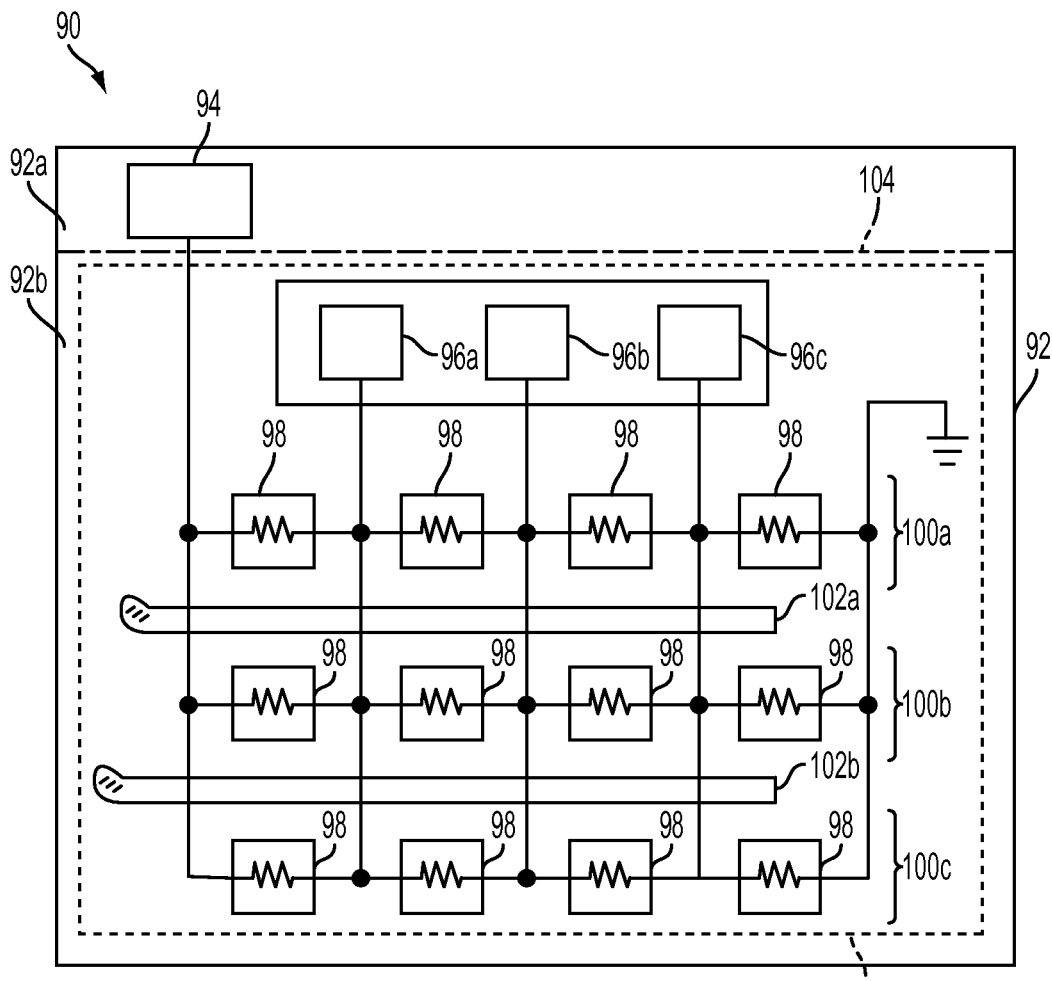
FIG. 10 is a schematic illustration of a sensor device including a sensor-enabled voltage source, reconfigurable voltage divider circuit, and display elements according an embodiment of the present disclosure.

A reconfigurable voltage divider base circuit 97 is provided on substrate 92, and comprises a plurality of optional circuit elements 98, in rows 100a, 100b, 100c arranged such that they are connected at an input thereof to voltage source 94 and at an output thereof to one of indicator elements 96a, 96b or 96c. In the embodiment shown, each optional circuit element 98 functions as a threshold devices to provide a display driving signal to the associated display element 96a, 96b, 96c. Each optional circuit element provides a different threshold such that indicators 96a, 96b, 96c may indicate a relative degree of sensed shock, for example with indicators 96a, 96b, 96c comprising individual bistable display elements and by how many and which of the individual display elements have changed display state. While each optional circuit element 98 is illustrated in FIG. 10 as a resistor, many other electronic components may alternatively or also be employed to provide a threshold function. Furthermore, while shown as essentially similar composition and function, the various optional circuit elements 98 may each have a different composition of elements and function, depending on the application of the presently disclosed embodiment.

Separating each of rows 100a, 100b, 100c are separation mechanisms 102a, 102b, such as the adhesive tabs or other forms of mechanism described above. Removal of a separation mechanism 102a, 102b results in removal of an associated row of optional circuit elements 98 from voltage divider base circuit 97. For example, removal of separation mechanism 102b results in removal of optional circuit elements 98 comprising row 100c, thereby changing the circuit characteristics of voltage divider base circuit 97. As an alternative to separation mechanisms 102a, 102b, optional circuit elements 98 in rows 100a, 100b, 100c may be printed on removable members (not shown) such that removing such a member removes the optional circuit elements 98 formed thereon.

Figure 11:
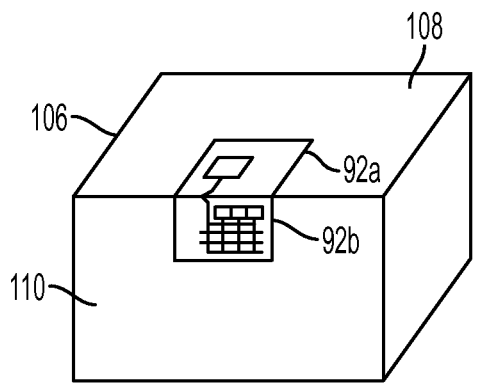
FIG. 11 is a perspective illustration of the sensor device of FIG. 10 formed on a flexible substrate and secured to a shipping package, for example for detecting physical shock to which the shipping package is subjected, according an embodiment of the present disclosure.

As previously mentioned, one advantage of many circuits formed by printed electronics processes is that they may be formed on flexible substrates and thus may be conformably applied to non-planar surface. Thus, in one optional variation of the present embodiment, the aforementioned substrate 92 is relatively flexible or conformable. For example, substrate 92 may be foldable, such as at a perforated or marked fold line 104 so as to be applied to multiple surfaces of a package 106 or the like, as illustrated in FIG. 11, with a first portion 92a of substrate 92 conforming to a first surface 108 of package 106 and a second portion 92b of substrate 92 conforming to a second surface 110 of package 106. In one application, the embodiments of FIGS. 10 and 11 can provide a reconfigurable impact counter for packaging illustrated in FIG. 11.

Figure 12:
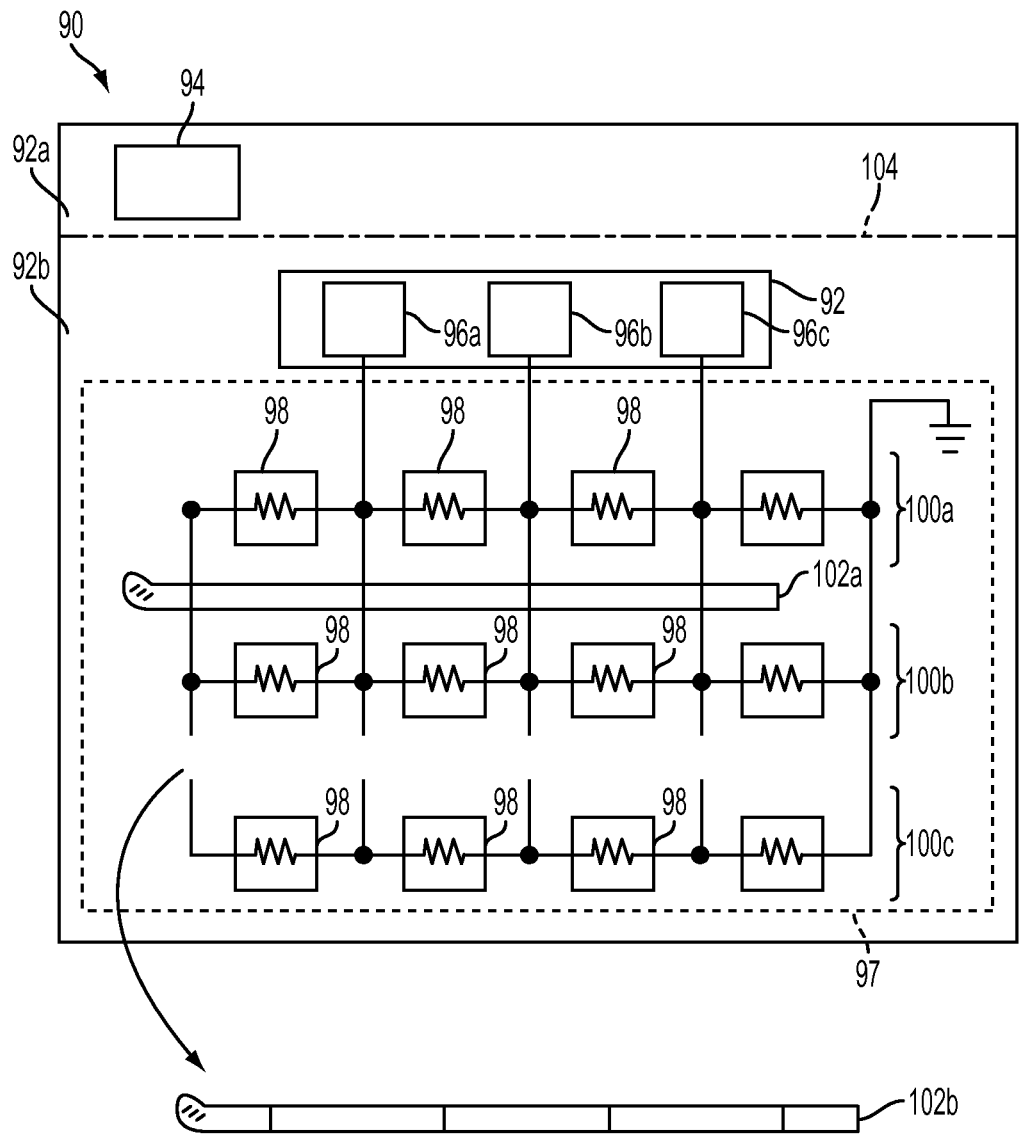
FIG. 12 is a schematic illustration of the sensor device of FIG. 10 having separation mechanism removed from the substrate to thereby remove a row of optional circuit elements from the reconfigurable voltage divider circuit according an embodiment of the present disclosure.

Returning to FIG. 10, the piezoelectric voltage source, indicators 96a, 96b, 96c, and reconfigurable voltage dividing base circuit 97 function as a shock sensor, as described in U.S. application Ser. Nos. 12/907,880 and 12/907,891, each being incorporated herein by reference. By selective removal of one or more of separation mechanisms 102a, 102b, as shown in FIG. 12, the circuit characteristics of the base circuit may be reconfigured, for example to thereby adjust the sensitivity of the sensor, setting for package weight, and other sensor attributes.

It will now be appreciated that a general principle of the present disclosure is the introduction to or removal from a base circuit of one or more optional circuit elements. There are a great many different methods contemplated for this introduction or removal of optional circuit elements. A common characteristic of such methods, however, is relatively very low cost, simple connection/removal method for low cost, thin and light, robust optional circuit elements, such as may be obtained by printed electronic processes on low cost, flexible substrates.

Each of the above examples is provided to illustrate various facets of the present disclosure. The limitations of the claims, not the examples in this description section, are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed:

1. A reconfigurable printed electronic circuit, comprising:
   a substrate;
   a printed electronic base circuit with at least a portion thereof formed on said substrate;
   an optional printed electronic circuit element with at least a portion thereof formed on said substrate;
   at least one terminal carried by said optional printed electronic circuit element;
   at least one electrical component carried by said optional printed electronic circuit element and communicatively coupled to said at least one terminal;
   a separation mechanism permitting an at least partial separation of said optional circuit element from said substrate;
   whereby separation of said optional circuit element by said separation mechanism facilitates a change in circuit characteristics of said base circuit;
   wherein said optional printed electronic circuit element is separated from said substrate by said separation mechanism, and further wherein said optional printed electronic circuit element forms a part of said printed electronic base circuit to thereby result in said change in the circuit characteristics of said printed electronic base circuit and, wherein a portion of said optional printed electronic circuit element remains joined to said substrate, and said optional printed electronic circuit element is folded over at a portion thereof joined to said substrate such that said at least one terminal makes electrical interconnection to said printed electronic base circuit to thereby introduce said at least one electrical component into said printed electronic base circuit.

2. The reconfigurable printed electronic circuit of claim 1, wherein said optional printed electronic circuit element is folded over such that said at least one terminal makes electrical interconnection to said printed electronic base circuit, said at least one terminal is permanently electrically interconnected to said printed electronic base circuit.

3. A reconfigurable printed electronic circuit, comprising:
a substrate;
a printed electronic base circuit with at least a portion thereof formed on said substrate;
an optional printed electronic circuit element with at least a portion thereof formed on said substrate;
at least one terminal carried by said optional printed electronic circuit element and in electrical contact with said printed electronic base circuit;
at least one electrical component carried by said optional printed electronic circuit element and electrically coupled to said at least one terminal such that said at least one electrical component is electrically coupled to and forms a part of said printed electronic base circuit;
a separation mechanism disposed in an electrically conductive path connecting said at least one terminal and said at least one electrical component, said separation mechanism further disposed for displacement such that the electrical coupling between said at least one terminal and said at least one electrical component may be broken by said displacement;
whereby separation of said optional circuit element by said separation mechanism facilitates a change in circuit characteristics of said base circuit; and
wherein with said separation mechanism in place said optional printed electronic circuit element remains electrically coupled to said printed electronic base circuit, and with said separation mechanism displaced said electrical coupling between said at least one terminal and said at least one electrical component is broken, thereby removing said optional printed electronic circuit element from said printed electronic base circuit, resulting in said change in the circuit characteristics of said printed electronic base circuit.

4. A printed electronic event sensor device, comprising:
a voltage source that responds to the detection of an event by generating a voltage pulse having a pulse amplitude and pulse width, said voltage source comprising a pulse generator comprising a printed piezoelectric detector that responds to physical strain due to shock by generating a voltage pulse;
a reconfigurable printed voltage dividing base circuit comprising a plurality of individual threshold devices, that receive said voltage pulse and generate, responsive to said pulse amplitude and said pulse width, a driving signal, at least a portion of said individual threshold devices being optional individual threshold devices;
a separation mechanism permitting separation of at least a portion of said optional individual threshold devices from said printed voltage dividing circuit; and
an indicator comprising a plurality of individually addressable indicator elements, each said individually addressable indicator element connected to at least one of said threshold devices, each said individually addressable indicator element further responsive to said driving signal to produce an indication indicative of said detection of an event by way of said driving signal.

5. The printed electronic event sensor device of claim 4, wherein said plurality of individual threshold devices are arranged in rows, and a separation mechanism is disposed between pairs of said rows such that removal of said separation mechanism results in removal of a row of individual threshold devices from said printed voltage dividing circuit, thereby resulting in a change in the circuit characteristics of said base circuit.

6. The printed electronic event sensor device of claim 5, wherein said plurality of individual threshold devices are arranged in rows, each said row being formed on a separation mechanism such that removal of said separation mechanism results in removal of the row of individual threshold devices formed thereon from said printed voltage dividing circuit, thereby resulting in a change in the circuit characteristics of said base circuit.

7. The printed electronic event sensor device of claim 4, further comprising a flexible substrate on which said voltage source, said printed voltage dividing circuit, said separation mechanism, and said indicator are formed.

8. The printed electronic event sensor device of claim 4, wherein said indicator is a display, and said individually addressable indicator elements are visual display elements, and said driving signal is a display driving signal such that said display may respond to said display driving signal to indicate a detected event.

* * * * *